(12) United States Patent
Hall et al.

(10) Patent No.: US 8,635,765 B2
(45) Date of Patent: Jan. 28, 2014

(54) METHOD OF FORMING MICRO-ELECTRICAL-MECHANICAL STRUCTURE (MEMS)

(75) Inventors: Dawn D. Hall, Underhill, VT (US); Mark C. H. Lamorey, South Burlington, VT (US); Anthony K. Stamper, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 296 days.

(21) Appl. No.: 13/161,126

(22) Filed: Jun. 15, 2011

(65) Prior Publication Data

US 2012/0318648 A1    Dec. 20, 2012

(51) Int. Cl.
*H01H 11/00*    (2006.01)
*H01H 65/00*    (2006.01)

(52) U.S. Cl.
USPC ............... 29/622; 29/825; 29/846; 29/874

(58) Field of Classification Search
USPC ............ 29/622, 825, 829, 846, 874; 200/181; 335/78
See application file for complete search history.

(56) References Cited

U.S. PATENT DOCUMENTS

| | | | |
|---|---|---|---|
| 5,262,000 A * | 11/1993 | Welbourn et al. .......... | 216/2 |
| 5,376,762 A | 12/1994 | Kimberlin | |
| 6,281,838 B1 | 8/2001 | Hong | |
| 6,373,007 B1 | 4/2002 | Calcatera et al. | |
| 6,373,771 B1 | 4/2002 | Fifield et al. | |
| 6,543,286 B2 | 4/2003 | Garverick et al. | |
| 6,625,399 B1 | 9/2003 | Davis | |
| 6,705,165 B2 | 3/2004 | Garverick et al. | |
| 6,845,034 B2 | 1/2005 | Bhattacharyya | |
| 6,853,658 B1 | 2/2005 | DiJaili et al. | |
| 6,879,341 B1 | 4/2005 | Silverbrook | |
| 6,961,257 B2 | 11/2005 | Garverick et al. | |
| 6,977,528 B2 | 12/2005 | Kang et al. | |
| 6,989,603 B2 | 1/2006 | Zhang | |
| 7,020,560 B2 | 3/2006 | Sayler et al. | |
| 7,030,654 B2 | 4/2006 | Mentz et al. | |

(Continued)

OTHER PUBLICATIONS

Chakraborty et al., "Design and analysis of MEMS cantilever based binary logic inverter". 2009 International Conference on Advances in Computing, Control, and Telecommunication Technologies, pp. 184-188.

*Primary Examiner* — Thiem Phan
(74) *Attorney, Agent, or Firm* — Anthony Canale; Roberts Mlotkowski Safran & Cole, P.C.

(57) ABSTRACT

A method of forming a micro-electrical-mechanical structure (MEMS), includes forming a plurality of electrodes on a substrate, forming a beam structure in electrical contact with a first of the electrodes, and bending the beam structure with a thermal process. The method further includes forming a cantilevered electrode extending over an end of the bent beam structure, and returning the beam structure to its original position, which will contact the cantilevered electrode in a normally closed position.

14 Claims, 6 Drawing Sheets

(56) References Cited

U.S. PATENT DOCUMENTS

| | | |
|---|---|---|
| 7,158,401 B2 | 1/2007 | Bhattacharyya |
| 7,187,735 B2 | 3/2007 | Kent, III et al. |
| 7,215,229 B2 * | 5/2007 | Shen et al. .............. 335/78 |
| 7,313,053 B2 | 12/2007 | Wodnicki |
| 7,355,258 B2 | 4/2008 | Valenzuela et al. |
| 7,423,921 B2 | 9/2008 | Asano et al. |
| 7,426,501 B2 | 9/2008 | Nugent |
| 7,429,125 B2 | 9/2008 | Sharma et al. |
| 7,612,270 B1 | 11/2009 | Zhu |
| 7,631,953 B2 | 12/2009 | Bergstedt et al. |
| 7,633,095 B1 | 12/2009 | Kerr et al. |
| 2002/0186108 A1 | 12/2002 | Hallbjorner |
| 2003/0052752 A1 | 3/2003 | Kirabayashi |
| 2010/0013725 A1 | 1/2010 | Lempkowski |

* cited by examiner

METHOD OF FORMING MICRO-ELECTRICAL-MECHANICAL STRUCTURE (MEMS)

FIELD OF THE INVENTION

The invention relates to semiconductor structures and methods of manufacture and, more particularly, to normally closed (shut) micro-electro-mechanical switches (MEMS), methods of manufacture and design structures.

BACKGROUND

Integrated circuit switches used in integrated circuits can be formed from solid state structures (e.g., transistors) or passive wires (MEMS). MEMS switches are typically employed because of their almost ideal isolation, which is a critical requirement for wireless radio applications where they are used for mode switching of power amplifiers (PAs) and their low insertion loss (e.g., resistance) at frequencies of 10 GHz and higher. MEMS switches can be used in a variety of applications, primarily analog and mixed signal applications. One such example is cellular telephone chips containing a power amplifier (PA) and circuitry tuned for each broadcast mode. Integrated switches on the chip would connect the PA to the appropriate circuitry so that one PA per mode is not required.

Depending on the particular application and engineering criteria, MEMS structures can come in many different forms. For example, MEMS can be realized in the form of a cantilever beam structure. In the cantilever structure, a cantilever arm (suspended electrode with one end fixed) is pulled toward a fixed electrode by application of an actuation voltage. The voltage required to pull the suspended electrode to the fixed electrode by electrostatic force is called pull-in voltage, which is dependent on several parameters including the length of the suspended electrode, spacing or gap between the suspended and fixed electrodes, and spring constant of the suspended electrode, which is a function of the materials and their thickness. Alternatively, the MEMS beam could be a bridge structure, where both ends are fixed.

However, as semiconductors become smaller, due to scaling, several issues can arise in the MEMS. For instance, silicon scaling leads to smaller ratios of power required to turn on and turn off semiconductor devices, which results in power being transferred through semiconductor devices when power should not be transferred, e.g., when the semiconductor devices are turned off. This is evidenced by off currents in semiconductor devices being measurable. Moreover, silicon scaling makes it more difficult and more costly to radiation harden semiconductor devices on chips, especially when there are many devices and each of the devices are extremely small.

Accordingly, there exists a need in the art to overcome the deficiencies and limitations described hereinabove.

SUMMARY

In a first aspect of the invention, a method of forming a micro-electrical-mechanical structure (MEMS), includes forming a plurality of electrodes on a substrate, and forming a beam structure in electrical contact with a first of the electrodes; bending the beam structure with a thermal process. The method further includes forming a cantilevered electrode extending over an end of the bent beam structure, and returning the beam structure to its original position, which will contact the cantilevered electrode in a normally closed position.

In another aspect of the invention, a structure includes a beam structure includes a first end hinged on a first electrode and in electrical contact with a second electrode, in its natural state when not actuated.

In yet another aspect of the invention, a method in a computer-aided design system for generating a functional design model of a micromechanical switch, includes generating a functional representation of a beam structure comprising a first end hinged on a first electrode and in electrical contact with a second electrode, in its natural state when not actuated.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a normally closed micro-electro-mechanical switch (MEMS), which comprises the structures of the present invention. In still further embodiments, a method in a computer-aided design system is provided for generating a functional design model of the normally closed MEMS. The method comprises generating a functional representation of the structural elements of the normally closed MEMS.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to normally closed (shut) micro-electro-mechanical switches (MEMS), methods of manufacture and design structures. More specifically, the present invention is directed to normally closed MEMS structures, which include a hinged beam structure fabricated in a closed position. In embodiments, the beam structure of the normally closed MEMS is, in operation, normally in electrical contact with an electrode. Upon actuation of a control electrode, the cantilever beam structure will be separated from the electrode, thereby opening the switch.

In embodiments, the beam structure of the normally closed MEMS is fabricated with a stress film. In embodiments, the stress film has a coefficient of thermal expansion (CTE) different from that of the beam structure of the normally closed MEMS. The stress film provides stress on the beam structure of the normally closed MEMS during manufacturing which, in turn, bows or bends the cantilever beam structure of the normally closed MEMS, e.g., upon application of heat. In this position, an upper electrode can be fabricated, such that it will not be in contact with the beam structure. In embodiments, upon removal of the stress film, the beam structure of the normally closed MEMS returns to its natural position, e.g., in electrical contact with the electrode. In this way, the beam structure of the normally closed MEMS remains in contact with the electrode, and upon application of voltage by a control electrode, will be separated therefrom (e.g., resulting in an open circuit). In embodiments, the normally closed beam structure can be assembled into a complementary MEMS based structure, and can be implemented as an inverter, NAND, SRAM cell and other standard CMOS logic gate structures.

Advantageously, the structures of the present invention can completely turn off at least one device through physically and electrically disconnecting, e.g., separating, the beam structure from an output electrode. Further, the structures of the present invention may prevent large off currents leaking through semiconductor devices since a conduction mechanism (e.g., beam structure) is tunneling through air. The MEMS devices of the present invention are also undisturbed by dynamic switching and power variations from such switching.

Figure 1:
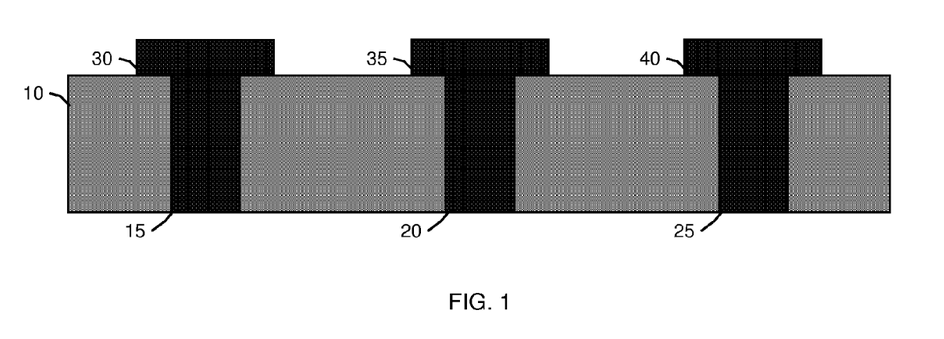
FIGS. 1-6 show fabrication steps and respective structures in accordance with aspects of the invention.

FIG. 1 shows a structure and respective processes for fabricating in accordance with aspects of the invention. The structure includes a substrate 10 (e.g., a wafer body) that, in embodiments, can include any bulk substrate, such as silicon, copper, aluminum, etc. Metal contacts 15, 20, and 25 are formed in trenches of the substrate 10. In embodiments, the metal contacts 15, 20, 25 may be formed through for example, by conventional lithography, etching and deposition processes. For example, a resist can be formed on the substrate 10 and exposed to light to form openings (patterns). A reactive ion etching (RIE), for example, may then be used to form trenches in the substrate 10. The trenches can be filled with conductive materials such as, for example, copper, tungsten, and/or aluminum, to form the metal contacts 15, 20, 25. The surface of the structure can be planarized using a chemical mechanical polishing (CMP).

Still referring to FIG. 1, conductive pads 30, 35, and 40 are formed on the surface of the structure, in physical and electrical contact with the contacts 15, 20, and 25, respectively. In embodiments, the conductive pads 30, 35, 40 can be formed by any conventional processes such as, for example, a damascene process or blanket metal deposition and RIE process. In embodiments, the conductive pads 30, 35, 40 can be any conductive material such as, for example, aluminum, copper and/or tungsten.

In a damascene process, an insulator film, e.g., oxide, may be formed on the surface of the structure, which is then polished, e.g., via a CMP. Trenches can then be etched into the film using conventional lithography and etching processes. The trenches are then filled with conductive material, such as copper, tungsten, and/or aluminum. The surface of the structure is then planarized using a CMP. A portion or all of the film may be removed; although, in embodiments, some or all of the film may remain on the surface for subsequent processing steps.

In an alternative process, the conductive pads 30, 35, 40 can be formed by a blanket deposition and RIE process. For example, conductive material can be blanket-deposited on the structure and etched using conventional RIE processes. More specifically, the conductive material can be blanket deposited using a sputtering or vapor deposition process. A resist can be formed on the conductive material, and exposed to light to form openings. The exposed conductive material can then be removed using a RIE process, through the openings, to form the conductive pads, 30, 35, 40. The resist can then be removed using conventional ashing processes.

Still referring to FIG. 1, in one illustrative, non-limiting example, the conductive pads 30, 35, 40 can have a thickness within a range conventional to one of ordinary skill in the art. As should be understood by those of ordinary skill in the art, each of the conductive pads 30, 35, 40 comprises a respective portion of an input electrode, a control electrode, and an output electrode, respectively.

Figure 2:
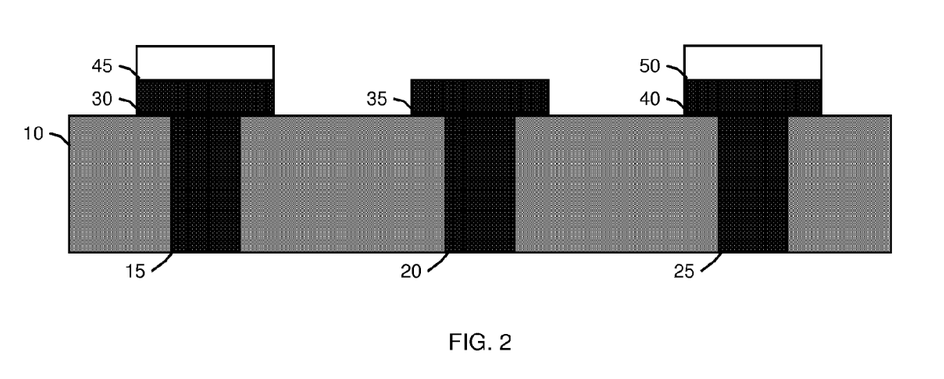

In FIG. 2, conductive pads 45 and 50 are formed on the conductive pads 30 and 40, respectively, to form raised electrodes, e.g., input and output electrode or ground. The conductive pads 45 and 50 are in physical and electrical contact with the conductive pads 30 and 40, respectively. In embodiments, the conductive pads 45 and 50 can be formed through any conventional processes including, for example, conventional damascene or blanket metal deposition and RIE process. For example, in a damascene process, an insulator film, e.g., oxide, may be formed over the exposed portions of the substrate 10 (or, in embodiments, any oxide film remaining in previous processing steps) and the conductive pads 30, 35 and 40. In embodiments, the film can then be polished, e.g., via a CMP. The film then undergoes an etching process to form trenches aligned with the conductive pads 30 and 40. The trenches are filled with conductive materials, such as copper, tungsten, and/or aluminum, and thereafter planarized to form conductive pads 45 and 50. In embodiments, the conductive pads 35, 45 and 50 can be masked, so that the film can be removed, while protecting the conductive pads. In embodiments, a portion or all of the film can remain on the surface for subsequent processes.

Still referring to FIG. 2, in alternative embodiments, the conductive pads 45 and 50 can be formed using a conventional blanket deposition and RIE process. In this scenario, conductive material may be blanket-deposited on the structure, e.g., substrate 10, any remaining film, as well as on the conductive pads 30, 35 and 40, using conventional deposition processes. The conductive material is then masked over the conductive pads 30 and 40, and the remaining, exposed portions of the conductive material are removed, e.g., etched, using a RIE process. The mask is then removed, leaving the conductive pads 45 and 50, in electrical contact and aligned with the conductive pads 30 and 40. In embodiments, any residual film from any previous damascene process may also be removed; although, the present invention also contemplates the residual oxide remaining on the surface for subsequent processing steps.

Still referring to FIG. 2, in one illustrative, non-limiting example, the conductive pads 45, 50 can include a thickness within a range conventional to one of ordinary skill in the art. In embodiments, the conductive pads 45 and 50 form portions of the input electrode and the output electrode, respectively, of the MEMS device. In this way, the input and output electrodes are raised structures with respect to a control electrode, e.g., the conductive pad 35 and the metal contact 20.

Figure 3:
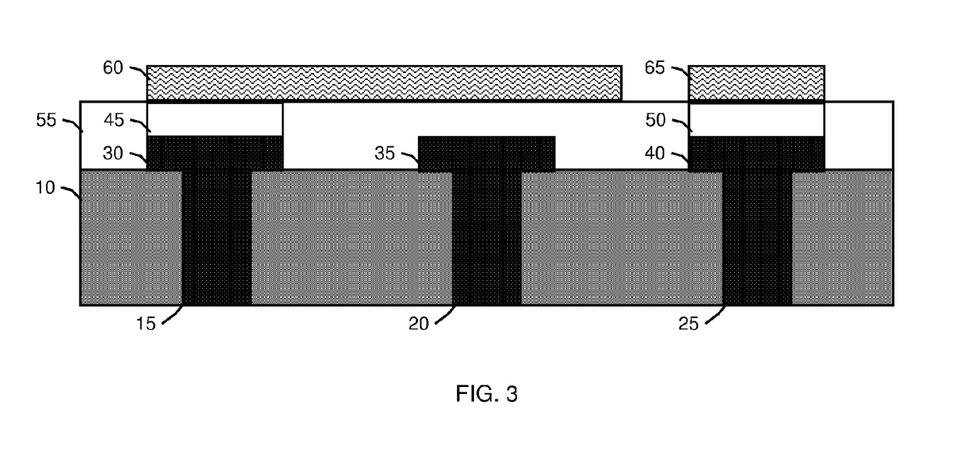

In FIG. 3, an insulator film 55 is formed on the structure, e.g., on the conductive pads 35, 45, and 50 and any exposed portions of the underlying substrate 10. In embodiments, the insulator film 55 can be an oxide or other insulator film used during previous damascene processes, which will reduce overall manufacturing time and costs. In embodiments, the insulator film 55 can alternatively be formed through any conventional oxidation process and/or a chemical vapor deposition (CVD) process. After formation, the insulator film 55 may be polished (e.g., via a CMP) to a surface level of the conductive pads 45 and 50, e.g., to expose a surface of the conductive pads 45 and 50.

Still referring to FIG. 3, a beam structure 60 and a conductive pad 65 are formed on the surface of the insulator film 55. In embodiments, the beam structure 60 is in physical and electrical contact with the conductive pads 45; whereas, the conductive pad 65 is in physical and electrical contact with the conductive pad 50. In embodiments, the beam structure 60 can be any type of cantilever beam such as, for example, a rotating gear, and/or any other type of beam known in the art. The cantilever beam structure 60 and the conductive pad 65 may include conductive metal materials, such as copper, tungsten, and/or aluminum.

The beam structure 60 and the conductive pad 65 can be formed using a damascene process or metal deposition and RIE processes, known to those of skill in the art. For example, in a damascene process, an insulator film 55, e.g., oxide, is formed on the structure and polished, e.g., via a CMP, to expose the surfaces of the conductive pads 45 and 50. In embodiments, the insulator film 55 can be a film formed during previous damascene processes. A second insulator film is then formed on the insulator film 55, which is then subjected to a conventional patterning process to form trenches. A conductive material then fills the trenches, e.g., copper, tungsten, and/or aluminum. The additional layer of insulator film can then be removed, leaving behind the beam structure 60 and the conductive pad 65.

In an alternative embodiment, a blanket deposition and RIE process may be used to form the cantilever beam structure 60 and the conductive pad 65. In this alternative approach, conductive material can be blanket-deposited on the insulator film 55 and patterned to form the cantilever beam structure 60 and the conductive pad 65. The deposition of the conductive material may be a vapor deposition process or a sputtering process, for example. The patterning can be performed using conventional lithographic and etching (RIE) processes. In either approach, the insulator film (which may include the film 55) can be selectively removed or left intact for subsequent processes.

In one illustrative, non-limiting example, the beam structure 60 and the conductive pad 65 can have a thickness within a range conventional to one of ordinary skill in the art. Also, as shown in FIG. 3, the beam structure 60 is hinged mounted onto the input electrode, e.g., metal contacts 15 and pads 30, 40. This will allow the beam structure 60 to either contact or separate from an output electrode.

Figure 4:
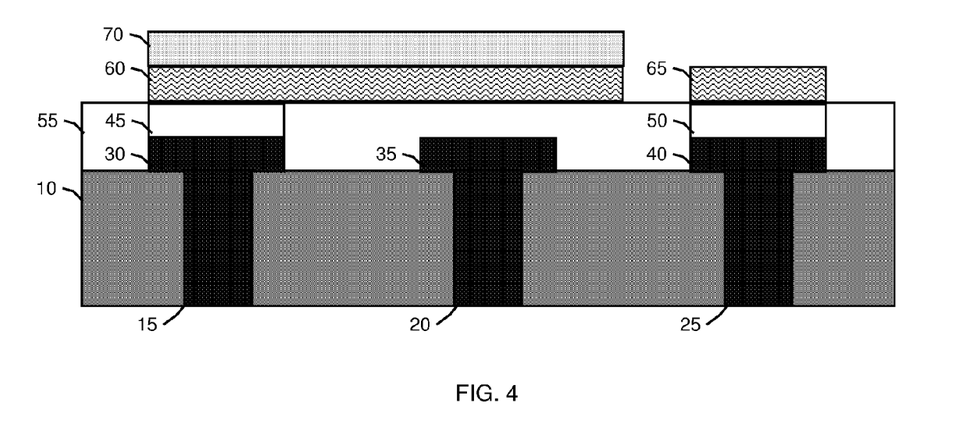

In FIG. 4, a stress film 70 is formed on the cantilever beam structure 60. In embodiments, the stress film 70 can include any material with a coefficient of thermal expansion (CTE) that is greater than a CTE of the beam structure 60. For example, if the beam structure 60 includes copper, the stress film 70 may include a polymer, and be formed in a thickness determined based on a ratio of the CTE between the beam structure 60 and the stress film 70, and a desired angle of deflection between the beam structure 60 and the stress film 70. In embodiments, the stress film 70 may include one or more of the following materials with their respective CTE's (in parts per million (ppm) per degree Celsius (° C.)):

TABLE 1

| Material | CTE (ppm/° C.) |
|---|---|
| AlAs | 4.9 |
| AlP | 4.5 |

TABLE 1-continued

| Material | CTE (ppm/° C.) |
|---|---|
| Alumina | 6-7 |
| AsSb | 4 |
| Copper | 16.7 |
| Cu/I/Cu | 8.4 |
| Cu/Mo/Cu | 6 |
| Cu/Mo—Cu/Cu | 6-10 |
| E-glass | 54 |
| Epoxy | 55 |
| Fused Silica | 0.55 |
| Gallium Arsenide (GaAs) | 6.86 |
| GaP | 4.5 |
| GaSb | 7.75 |
| Germanium (Ge) | 5.8 |
| InAs | 4.52 |
| InP | 4.75 |
| InSb | 5.37 |
| Invar | 1.3 |
| Kovar | 5.9 |
| Molybdenum | 7.0-7.1 |
| Polymers | 50-200 |
| S-glass | 16 |
| Silicon | 2.6 |
| Silicon Nitride ($Si_3N_4$) | 3.2 |
| Silicon resins | 30-300 |
| Tin-Lead Solder | 27 |
| Titanium | 9.5 |
| Tungsten | 5.7-8.3 |

In embodiments, the stress film 70 can be formed using conventional deposition processes. For example, in embodiments, a mask can be formed over the conductive pad 65, e.g., deposited on the structure and patterned to remove portions aligned with the cantilever beam structure 60. The stress film 70 can then be deposited in the openings of the mask to form the stress film on a surface of the cantilever beam structure 60.

Figure 5:
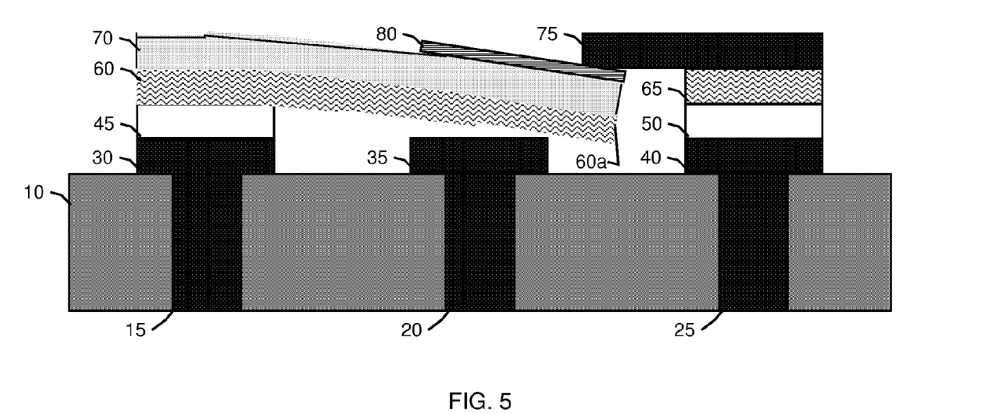

FIG. 5 shows several processing steps and a respective structure in accordance with aspects of the invention. In particular, in FIG. 5, a cantilevered conductive pad 75 is formed on the conductive pad 65 using, for example, a damascene process or blanket deposition and RIE processes. In either of these processes, the stress film 70 will impose a stress component on the beam structure 60 due to a CTE mismatch during the heating cycle of these processes, e.g., the CTE of the stress film 70 being greater than the CTE of the cantilever beam structure 60, resulting in a downward bowing or bending of the beam structure 60. This ensures that the beam structure 60 is not in contact with the cantilevered conductive pad 75 during fabrication processes, thereby ensuring that the beam structure 60 will not stick to the cantilevered conductive pad 75. In embodiments, the cantilevered conductive pad 75 will form the contact portion of the output electrode. In one illustrative, non-limiting example, the cantilevered conductive pad 75 can have a thickness and a length within ranges conventional to one of ordinary skill in the art.

To form the structure of FIG. 5, for example, the insulator film 55 or portions thereof underneath the beam structure 60 is removed by any conventional removal processes. This allows the beam structure 60 to bend downwards (e.g., towards the conductive pad 35) during subsequent thermal processes. In the damascene process, a second insulator film is formed on the structure, e.g., beam structure 60 and conductive pad 65, which is patterned to form an opening for deposition of the conductive material comprising the cantilevered conductive pad 75. In embodiments, the conductive material is preferably different than the material comprising the beam structure 60 to prevent these components from growing permanent bonds together if left in contact over time. During the formation of the insulator film, e.g., oxide, the beam structure 60 will bend downwards due to the CTE mismatch between the material of the beam structure 60 and the stress film 70. Thereafter, the insulator film can be removed, leaving the cantilevered conductive pad 75. In embodiments, the cantilevered conductive pad 75 extends beyond an end 60a of the beam structure 60. In this way, the cantilever beam structure 60 and cantilevered conductive pad 75 can make electrical contact.

In the blanket deposition and RIE process, an insulator film is first formed over the stress film 70 and other structures of the device, and planarized to form a planar, flat surface, which exposes the conductive pad 65. The conductive material is then blanket deposited on the insulator film and patterned to form the cantilevered conductive pad 75. Similar to the damascene process, the processes described in this alternative process are performed at an increased temperature, which will bend the beam structure 60 downwards due to the CTE mismatch between the material of the beam structure 60 and the stress film 70. In both the damascene process and the blanket deposition and RIE processes, the stress film 70 is removed through a selective etching process, e.g., a chemistry that is selective to the removal of the material comprising the stress film 70.

Still referring to FIG. 5, in embodiments, the beam structure 60 and the cantilevered conductive pad 75 can be composed of the same or similar conductive materials. In this case, a seed layer 80 can be formed on the stress film 70, in physical and electrical contact therewith. In embodiments, the seed layer 80 would be formed between the stress film 70 and the cantilevered conductive pad 75, where the conductive pad 75 is formed over at least a portion of the stress film 70 and the beam structure 60. The seed layer 80 can include metal materials, such as tungsten and/or magnesium. The seed layer 80 prevents the conductive metal materials of the beam structure 60 from migrating to the conductive metal materials of the conductive pad 75, and vice versa, and from growing permanent bonds together if left in contact over time.

Figure 6:
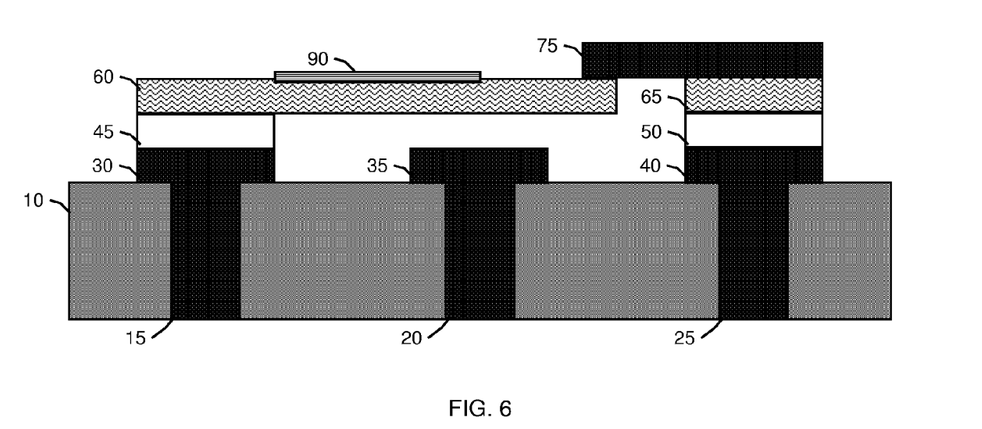

FIG. 6 shows a final structure and respective process steps in accordance with aspects of the invention. In this structure, the stress film 70 and the seed layer 80 are removed using conventional processes. As thus shown, upon the removal of the stress film 70, the beam structure 60 bends back to its original position, now in contact with the cantilevered conductive pad 75. As the cantilevered conductive pad 75 and the beam structure 60 are normally in contact with each other, the device of the present invention is in a normally shut (closed) state.

FIG. 6 also shows an optional compressive film 90 formed on the beam structure 60. In embodiments, after removal of the stress film 70, if the cantilevered conductive pad 75 is at a greater height than the beam structure 60, e.g., separated therefrom so as to not be in contact, the compressive film 90 can be formed on and in physical and electrical contact with the beam structure 60. The compressive film 90 may increase the height of the beam structure 60 such that the beam structure 60 can be in electrical contact with the conductive pad 75. The compressive film 90 may include at least one of the materials in Table 1 shown above, such that a material of the compressive film 90 has a different CTE at room temperature than the CTE of the conductive pad 75. This prevents the beam structure 60 and the conductive pad 75 from growing permanent bonds together if left in contact over time.

Figure 7:
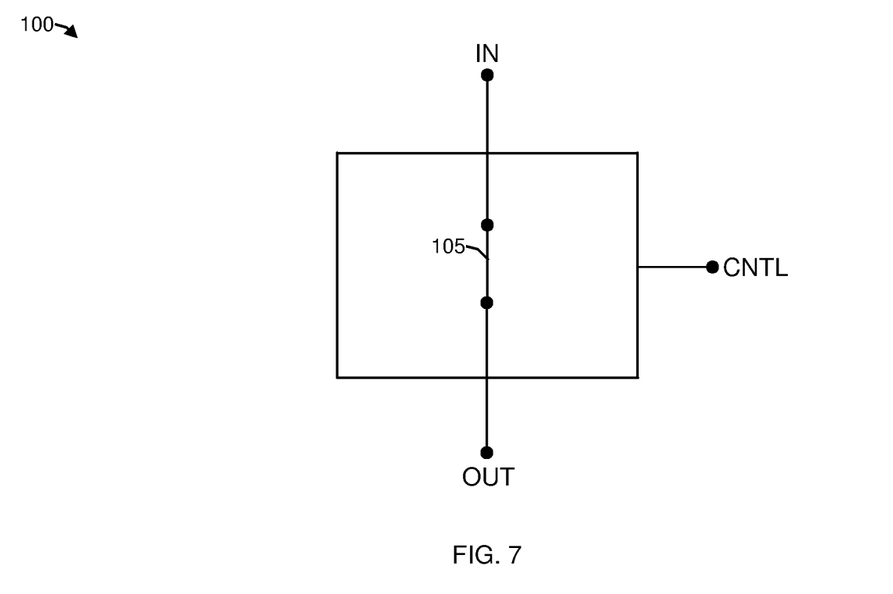
FIG. 7 shows an exemplary circuit diagram of the structure shown in FIG. 6 in accordance with aspects of the invention.

FIG. 7 shows an exemplary circuit diagram 100 of the final structure of FIG. 6 in accordance with aspects of the invention. The circuit diagram 100 includes an input electrode ("IN"), a control electrode ("CNTL"), an output electrode ("OUT"), and a device 105. In embodiments, the device 105 can be a cantilever beam (as shown here), or other switch mechanism in the normally closed state. The device 105 may include arms connected to ground. If the arms are connected to an integrated circuit power supply pin (VDD), then the device would be a MEMS-based normally open switch (NOS).

Still referring to FIG. 7, the device 105 is normally in the closed state, connecting to both the input electrode and the output electrode. Accordingly, when the control electrode is not supplying a control voltage, then the device 105 connects the input electrode to the output electrode, e.g., shut. In this case, the device 105 may receive an input voltage supplied from the input electrode, which can be connected to a voltage source such as another circuit. The device 105 may then transfer the input voltage to the output electrode, which can be connected to another circuit, for example. If the control electrode supplies a control voltage, then the device 105 will disconnect (separate) from the output electrode, e.g., be open. In this manner, the device 105 does not transfer any voltage between the input electrode and the output electrode.

Figure 8:
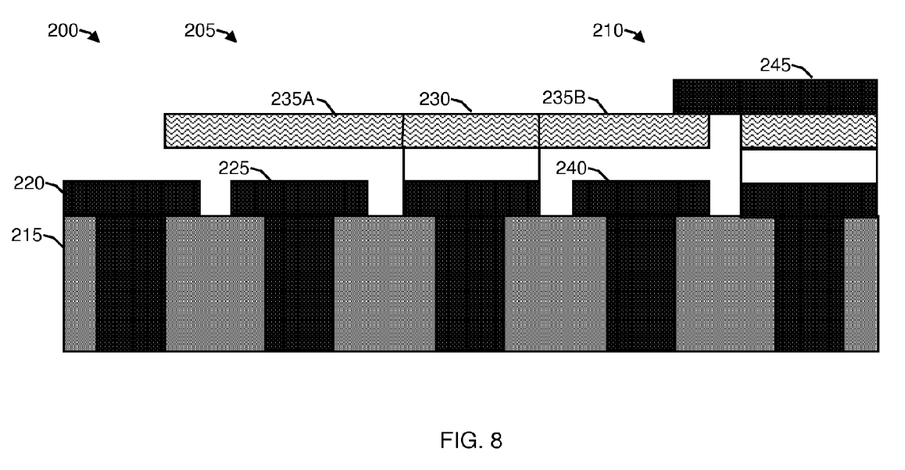
FIG. 8 shows an exemplary complementary MEMS-based structure and respective processing steps in accordance with aspects of the invention.

FIG. 8 shows an exemplary complementary MEMS -based structure 200 in accordance with aspects of the invention. More specifically, the complementary MEMS-based structure 200 is an inverter, which includes a MEMS-based open device 205 and a MEMS-based closed device 210, formed on a substrate 215 using processes as described in FIGS. 1-6. More specifically, the MEMS-based closed device 210 is formed in the manner as described in FIGS. 1-6; whereas the MEMS -based open device 205 does not include the use of a compressive film or the cantilevered beam structure, as an output electrode. Instead, the MEMS-based open device 205 will contact with a lower level ground electrode 220.

In embodiments, the MEMS-based open device 205 can include a ground electrode 220, an input electrode 225, an output electrode 230, and a beam structure 235A. The ground electrode 220 may be connected to ground and be built up to a first layer over the substrate 215. The input electrode 225 can be connected to a voltage source (e.g., another device) and be built up to a first layer over the substrate 215. The output electrode 230 may be connected to another device and be built up to a third layer over the substrate 215. The beam structure 235A can be a cantilever beam (as shown here), a rotating gear, and/or any other beam structure known in the art that may be switched between different states. The beam structure 235A is a device hinged on the output electrode that either connects or disconnects the ground electrode 220 and the output electrode 230, and is controlled by the input electrode 225. At an initial state (e.g., when there is no static voltage at the input electrode 225), the beam structure 235A is disconnected from the ground electrode 220, or the MEMS-based open device 205 is normally open.

Still referring to FIG. 8, in embodiments, the MEMS-based closed device 210 can include the output electrode 230, a beam structure 235B, an input electrode 240, and an integrated circuit power supply pin (VDD) 245. The VDD 245 may be connected to a power supply and be built up to the second layer and the third layer over the substrate 215. The input electrode 240 can be connected to a voltage source (e.g., another device) and be built up to the first layer over the substrate 215. The output electrode 230 may be connected to another device and be built up to the second layer and the third layer over the substrate 215. The beam structure 235B can be a cantilever beam (as shown here), a rotating gear, and/or any other beam structure known in the art that may be switched between different states. The beam structure 235B may include arms connected to ground. The beam structure 235B is a device hinged on the output electrode that either connects or disconnects the output electrode 230 and the VDD 245, and is controlled by the input electrode 240. At an initial state (e.g., when there is no static voltage at the input electrode 240), the beam structure 2358 connects the output electrode 230 and the VDD 245, or the MEMS-based closed device 210 is normally shut.

Figure 9:
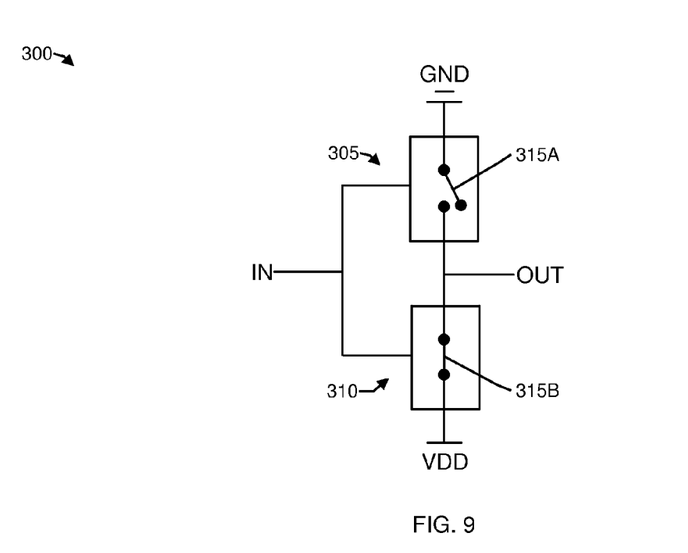
FIG. 9 shows an exemplary circuit diagram of the complementary MEMS-based structure in FIG. 8 in accordance with aspects of the invention.

FIG. 9 shows an exemplary circuit diagram 300 of the complementary structure shown in FIG. 8. More specifically, the circuit diagram 300 is of the complementary MEMS-based structure 200 (e.g., the inverter) of FIG. 8. The circuit diagram 300 includes a MEMS based open device 305 and a MEMS based closed device 310, e.g., the MEMS based open device 205 and the MEMS based closed device 210, respectively. The MEMS based open device 305 includes a ground electrode ("GND"), an input electrode ("IN"), an output electrode ("OUT"), and a beam structure 315A. The MEMS based closed device 310 includes the output electrode, the input electrode, a VDD electrode ("VDD"), and a beam structure 315B. In embodiments, each of the MEMS devices 315A, 315B can be a cantilever beam (as shown here), a rotating gear, and/or any other beam structure known in the art that may be switched between different states. Each of the beam structures 315A, 315B may include arms connected to ground.

Still referring to FIG. 9, the beam structure 315A is a device hinged on the input or output electrode that either connects or disconnects the ground electrode and the output electrode, while the beam structure 315B is a device hinged on the output electrode that either connects or disconnects the output electrode and the VDD electrode. The beam structures 315A, 315B are controlled by the input electrode. For example, if the input electrode (which can be connected to a voltage source such as another circuit) is not supplying an input voltage, then the beam structure 315A may be disconnected from the output electrode, or be open. Meanwhile, the beam structure 315B can be connected between the output electrode and the VDD electrode, or be shut. In this case, the beam structure 315B may receive a VDD voltage supplied from the VDD electrode, which can be connected to a power supply. The beam structure 315B may then transfer the VDD voltage to the output electrode, which can be connected to another circuit, for example. If the input electrode is supplying an input voltage, then the beam structure 315A may be connected between the ground electrode and the output electrode, or be shut. On the other hand, the beam structure 315B can be disconnected from the output electrode, or be open. In this manner, the beam structure 315A may receive a ground ("GND") voltage supplied from the ground electrode, which can be connected to ground. The beam structure 315A may then transfer the ground voltage to the output electrode. The circuit diagram 300 (e.g., the inverter) can be represented by the following truth table:

TABLE 2

| IN | OUT |
|---|---|
| 0 | VDD |
| 1 | GND | where the VDD voltage and the GND voltage may be set to any predetermined voltage level without impacting the switching performance of the structure of the invention.

Figure 10:
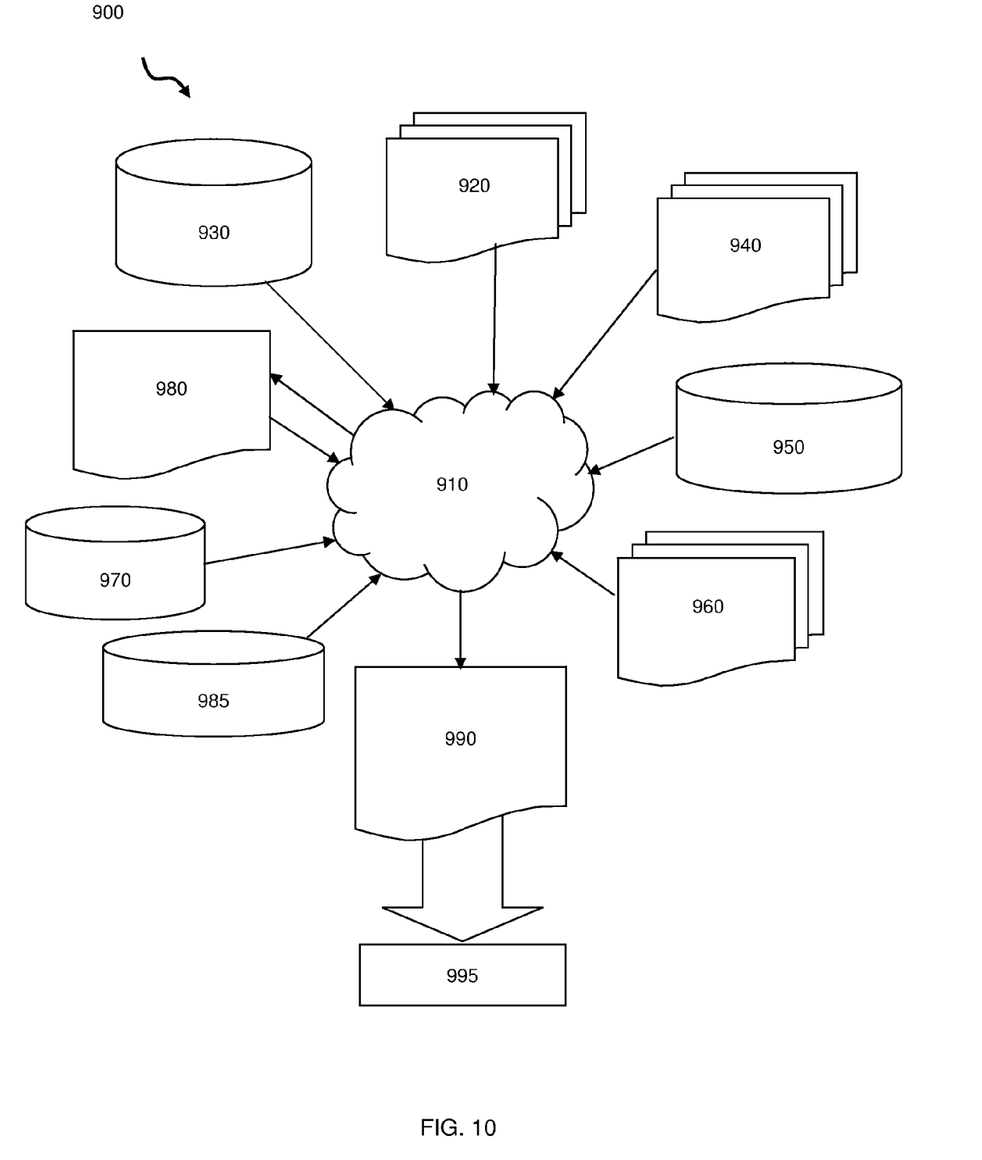
FIG. 10 is a flow diagram of a design process used in semiconductor design, manufacture, and/or test.

FIG. 10 is a flow diagram of a design process used in semiconductor design, manufacture, and/or test. FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9. In one embodiment, design structure 990 may comprise a compiled, executable HDL simulation model that functionally simulates the devices shown in FIGS. 1-9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of forming a micro-electrical-mechanical structure (MEMS), comprising:
    forming a plurality of electrodes on a substrate;
    forming a beam structure in electrical contact with a first of the electrodes;
    bending the beam structure with a thermal process;

forming a cantilevered electrode extending over an end of the bent beam structure; and returning the beam structure to its original position, which will contact the cantilevered electrode in a normally closed position.

2. The method of claim 1, wherein the bending of the beam structure comprises forming a stress film on the beam structure, and subjecting the beam structure and the stress film through a thermal cycle.

3. The method of claim 2, wherein the beam structure and the stress film have different coefficient of thermal expansion (CTE).

4. The method of claim 2, wherein the stress film is removed after forming of the cantilevered electrode, which returns the beam structure to its original position.

5. The method of claim 2, further comprising:

forming a seed layer between the stress film and the cantilevered electrode, the seed layer comprising a metal comprising at least one of tungsten and magnesium; and removing the stress film and the seed layer such that the beam structure bends back up to its original position and its end contacts the cantilevered electrode.

6. The method of claim 1, wherein the beam structure is formed from a first material and the cantilevered electrode is formed from a second material, different from the first material.

7. The method of claim 1, wherein the forming of the plurality of electrodes comprises forming a first and second raised electrode portion in a plurality of metal deposition steps and a third electrode is formed in a single metal deposition step, on the substrate, wherein the cantilevered electrode is formed on the second raised portion.

8. The method of claim 1, wherein the beam structure and the cantilevered electrode are formed from a same material, and a film is placed on top of the stress film prior to the fabricating of the cantilevered electrode.

9. The method of claim 1, further comprising forming a compressive film on beam structure.

10. The method of claim 1, wherein the plurality of electrodes are formed by a damascene process.

11. The method of claim 1, wherein the beam structure and the cantilevered electrode are formed by a damascene process.

12. The method of claim 1, wherein the beam structure is formed extending from one of the electrodes, as a cantilever.

13. The method of claim 1, wherein the beam structure is formed on an oxide film, and in electrical contact with one of the plurality of electrodes, formed as a raised electrode.

14. The method of claim 1, wherein the beam structure is formed in an open position and then placed in the closed position.

* * * * *